United States Patent
Torregrosa et al.

(10) Patent No.: US 9,552,962 B2
(45) Date of Patent: Jan. 24, 2017

(54) METHOD OF CONTROLLING AN ION IMPLANTER IN PLASMA IMMERSION MODE

(71) Applicant: ION BEAM SERVICES, Peynier (FR)

(72) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 265 days.

(21) Appl. No.: 14/349,501

(22) PCT Filed: Oct. 4, 2012

(86) PCT No.: PCT/FR2012/000392
§ 371 (c)(1),
(2) Date: Apr. 3, 2014

(87) PCT Pub. No.: WO2013/057390
PCT Pub. Date: Apr. 25, 2013

(65) Prior Publication Data
US 2014/0327358 A1    Nov. 6, 2014

(30) Foreign Application Priority Data

Oct. 6, 2011  (FR) .................................... 11 03032

(51) Int. Cl.
*H01J 37/32* (2006.01)
*H01J 37/317* (2006.01)
(Continued)

(52) U.S. Cl.
CPC .......... *H01J 37/3171* (2013.01); *C23C 14/48* (2013.01); *H01J 37/32009* (2013.01);
(Continued)

(58) Field of Classification Search
None
See application file for complete search history.

(56) References Cited

U.S. PATENT DOCUMENTS 6,237,527 B1 * 5/2001 Kellerman ........ H01J 37/32412
118/723 E
7,566,887 B2 * 7/2009 Huang .................. H01J 37/045
250/396 R
(Continued)

FOREIGN PATENT DOCUMENTS

FR      2 871 812 A1    12/2005
FR      2 871 934 A1    12/2005
(Continued)

OTHER PUBLICATIONS

Ken Yukimura et al, "Two Switch High Voltage Modulator for Plasma-Based Ion Implantation", Surface & Coatings Technology, vol. 156, No. 1-3, Jul. 1, 2002, pp. 66-70, XP-002314548.
(Continued)

*Primary Examiner* — Douglas W Owens
*Assistant Examiner* — Srinivas Sathiraju
(74) *Attorney, Agent, or Firm* — Sughrue Mion, PLLC

(57) ABSTRACT

The present invention relates to a method of controlling an ion implanter having a plasma power supply AP and a substrate power supply, the substrate power supply comprising:
an electricity generator;
a first switch SW1 connected between the generator and the output terminal of the substrate power supply; and
a second switch SW2 connected between the output terminal and a neutralization terminal;
the method including an implantation stage A-D and a neutralization stage E-H. The method also includes a relaxation stage C-F overlapping the implantation stage and the neutralization stage, during which relaxation stage the plasma power supply is inactivated. Furthermore, the neutralization stage includes a preliminary step E-F for closing the second switch, this preliminary
(Continued)

step being followed by a cancellation step F-G for activating the plasma power supply AP.

7 Claims, 2 Drawing Sheets

(51) Int. Cl.
 *C23C 14/48* (2006.01)
 *H01L 21/223* (2006.01)
(52) U.S. Cl.
 CPC .. *H01J 37/32146* (2013.01); *H01J 37/32412* (2013.01); *H01J 37/32422* (2013.01); *H01J 37/32706* (2013.01); *H01L 21/2236* (2013.01)

(56) References Cited

U.S. PATENT DOCUMENTS

| | | | | |
|---|---|---|---|---|
| 2007/0069157 A1* | 3/2007 | Mehta | ............ | H01J 37/32045 250/492.21 |
| 2008/0315127 A1* | 12/2008 | Torregrosa | ............ | C23C 8/36 250/492.3 |
| 2013/0153779 A1* | 6/2013 | Torregrosa | ............ | H01J 37/244 250/394 |
| 2014/0102370 A1* | 4/2014 | Torregrosa | ............ | C23C 14/48 118/723 VE |
| 2014/0110607 A1* | 4/2014 | Torregrosa | ............ | H01J 37/32412 250/492.3 |
| 2014/0326176 A1* | 11/2014 | Torregrosa | ............ | H01L 21/67069 118/500 |
| 2014/0353525 A1* | 12/2014 | Torregrosa | ............ | H01J 37/32917 250/492.3 |
| 2015/0325412 A1* | 11/2015 | Torregrosa | ............ | H01J 37/32357 250/492.3 |

FOREIGN PATENT DOCUMENTS

| | | |
|---|---|---|
| WO | 01/15200 A1 | 3/2001 |
| WO | 2007/013753 A1 | 2/2007 |

OTHER PUBLICATIONS

International Search Report of PCT/FR2012/000392, dated Jan. 16, 2013.

* cited by examiner

METHOD OF CONTROLLING AN ION IMPLANTER IN PLASMA IMMERSION MODE

CROSS REFERENCE TO RELATED APPLICATIONS

This application is a National Stage of International Application No. PCT/FR2012/000392 filed Oct. 4, 2012, claiming priority based on French Patent Application No. 1103032, filed Oct. 6, 2011, the contents of all of which are incorporated herein by reference in their entirety.

BACKGROUND OF THE INVENTION

The present invention relates to a method of controlling an ion implanter in plasma immersion mode.

The field of the invention is that of ion implanters operating in plasma immersion mode. Thus, implanting ions in a substrate consists in immersing the substrate in a plasma and in biasing it with a negative voltage of a few tens of volts to a few tens of kilovolts (generally less than 100 kV), so as to create an electric field capable of accelerating the ions of the plasma towards the substrate so that they become implanted therein. The atoms implanted in this way are referred to as "dopants".

The penetration depth of the ions is determined by their acceleration energy. It depends firstly on the voltage applied to the substrate and secondly on the respective natures of the ions and of the substrate. The concentration of implanted atoms depends on the dose, which is expressed as a number of ions per square centimeter, and on the implantation depth.

For reasons associated with the physics of plasmas, a few nanoseconds after the voltage has been applied, a sheath of ions is created around the substrate. The potential difference responsible for accelerating the ions towards the substrate lies across the boundaries of this sheath.

The growth of this sheath as a function of time follows the Child-Langmuir equation:

$$j_c = \frac{4}{9}\varepsilon_0 \left(\frac{2e}{M}\right)^{1/2} \frac{V_0^{3/2}}{s^2}$$

where:
 $j_c$ is current density;
 $\varepsilon_0$ is vacuum permittivity;
 e is the charge of the ion;
 M is the mass of the ion;
 $V_0$ is the potential difference across the sheath; and
 s is the thickness of the sheath.

By stipulating that the current density is equal to the amount of charge passing through the boundary of the sheath per unit time, ds/dt represents the travel speed of this boundary:

$$\frac{ds}{dt} = \frac{2}{9}\frac{s_0^2 \cdot u_0}{s^2}$$

In which expression, $s_0$ is given by:

$$s_0 = \left(\frac{2\varepsilon_0 V_0}{e \cdot n_0}\right)^{1/2}$$

it being understood that $u_0 = (2\ eV_0/M)$ is the characteristic speed of the ion and that $n_0$ is the density of the plasma.

The thickness of the sheath is associated mainly with the applied voltage, with the density of the plasma, and with the mass of the ions.

The equivalent impedance of the plasma, which conditions the implantation current, is directly proportional to the square of the thickness of the sheath. The implantation current thus decreases very quickly as the sheath becomes thicker.

After a certain length of time, it is necessary to proceed with re-initialization. This becomes practically essential once the sheath reaches the walls of the enclosure, thereby stopping the implantation mechanism.

In order to reinitialize the system, nearly all implanter manufacturers switch off the high voltage on the substrate, while maintaining the plasma ignited. It is therefore necessary to have a pulse generator that produces high-voltage pulses.

Thus, with reference to FIG. 1, document WO01/15200 proposes biasing the substrate by means of a power supply that comprises:
 a generator GEN having its positive pole connected to ground;
 a capacitor Ct in parallel with the generator GEN;
 a first switch IT1 having its first pole connected to the negative pole of the generator GEN and having its second pole connected to the output terminal O of the power supply; and
 a second switch IT2 having its first pole connected to the output terminal O and having its second pole connected to ground.

The method comprises the following stages:
 an implantation stage during which:
  the plasma power supply is activated;
  the first switch IT1 is closed; and
  the second switch IT2 is opened;
 a neutralization stage during which:
  the first switch IT1 is opened; and
  the second switch IT2 is closed.

The continuous presence of the plasma inside the enclosure gives rise to undesirable side-effects:
 particles are generated;
 heat is delivered to the substrate;
 the enclosure is attacked, giving rise to risks of that parts being processed will suffer metal contamination;
 charge effects are created, which effects are particularly troublesome in microelectronics applications; and
 during the stages in which the voltage applied to the substrate is rising and falling, implantation takes place at an acceleration voltage that is not stabilized.

Furthermore, document US 2007/069157 provides for the following succession of operations:
 activating the substrate power supply;
 after a certain time delay, activating the plasma power supply for the duration of one pulse;
 deactivating the plasma power supply; and
 after a certain time period, deactivating the substrate power supply.

It follows that during said period, the substrate power supply is activated and the plasma power supply is deactivated, which corresponds to a relaxation stage.

During the implantation stage, the zones of the substrate and that are electrically insulating become positively charged, with this taking place in cumulative manner. It goes without saying that this situation is not desirable, if only because of the resulting disturbances to the implantation process. It is therefore desirable to neutralize these positive charges by supplying electrons.

It is thus possible to provide a filament, however a filament will tend to vaporize. It is also possible to provide an electron gun, but that constitutes additional equipment that is relatively burdensome.

SUMMARY OF THE INVENTION

An object of the invention is thus to make it easier to neutralize positive charges.

The invention thus provides a method of controlling an ion implanter having a plasma power supply and a substrate power supply, the substrate power supply comprising:
  an electricity generator having its positive pole connected to ground;
  a first switch having its first pole connected to the negative pole of the generator and having its second pole connected to the output terminal of the substrate power supply; and
  a second switch having its first pole connected to the output terminal and having its second pole connected to a neutralization terminal;
  the method including an implantation stage during which:
  the plasma power supply is activated;
  the first switch is closed; and
  the second switch is opened;
  the method also including a neutralization stage during which:
  the first switch is opened; and
  the second switch is closed;
  the method being remarkable in that:
  it also includes a relaxation stage that overlaps the implantation stage and the neutralization stage, in which relaxation stage the plasma power supply is inactivated; and
  the neutralization stage includes a preliminary step of closing the second switch, the preliminary step being followed by a cancellation step of activating the plasma power supply.

Thus, during the cancellation step, the positive charges of the substrate are neutralized by the electrons of the plasma.

Advantageously, the cancellation step is followed by an inactivation step of deactivating the plasma power supply.

Preferably, the inactivation step is followed by an interruption step of opening the second switch.

Furthermore, if the voltage applied to the substrate varies while the plasma is ignited, the implantation parameters vary correspondingly. This applies in particular for the penetration depth of the dopants, which depth depends directly on the acceleration voltage.

Thus, a second object of the present invention is to stabilize the implantation parameters.

According to the invention, the implantation stage includes an initialization step of closing the first switch, this initialization step being followed after a stabilization period by an activation step of activating the plasma power supply.

It follows that the plasma is ignited after the voltage applied to the substrate carrier has stabilized.

In a preferred implementation, the activation step is followed by an extinction step of deactivating the plasma power supply.

Furthermore, the extinction step is followed by a pause step of opening the first switch.

As a result, the voltage applied to the substrate carrier is kept constant throughout the period that the plasma is powered.

The invention also provides an ion implanter that includes means for implementing the above-described method.

BRIEF DESCRIPTION OF THE DRAWINGS

The present invention appears below in greater detail in the context of the following description of an implementation given by way of illustration and with reference to the accompanying figures, in which.

Elements shown in more than one of the figures are given the same references in each of them.

DETAILED DESCRIPTION OF THE INVENTION

Figure 1:
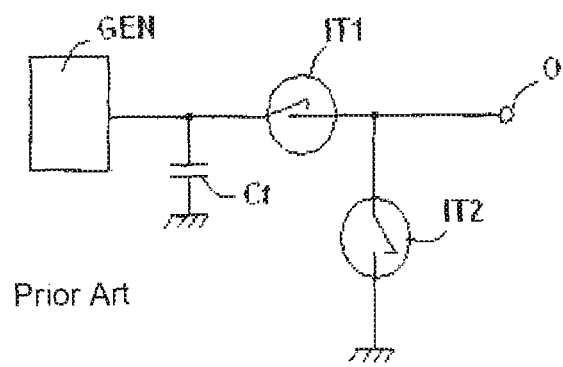
FIG. 1 shows a high-voltage power supply of the prior art.
Figure 2:
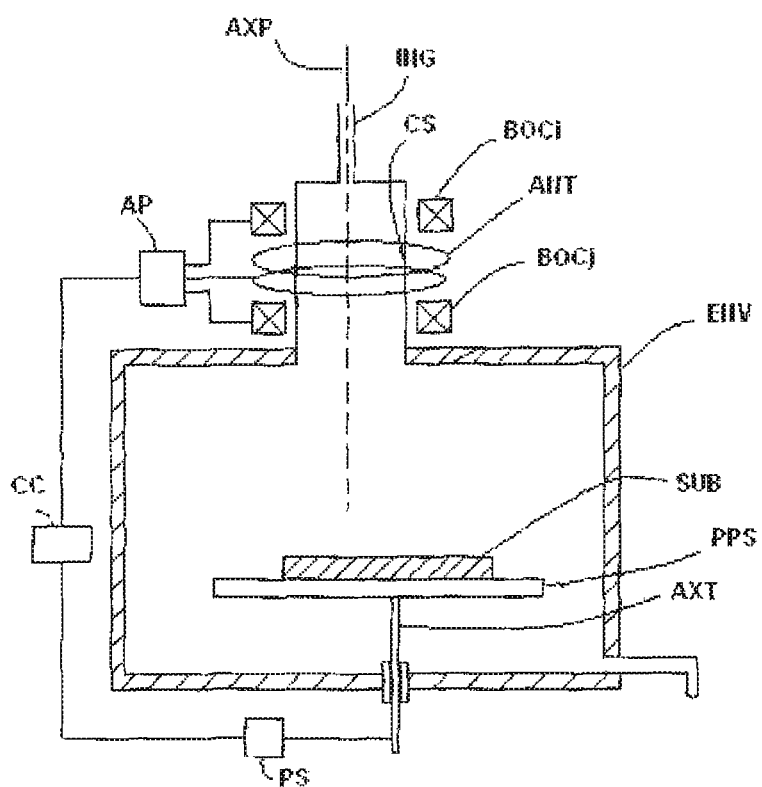
FIG. 2 shows an ion implanter provided with a control module.

With reference to FIG. 2, an ion implanter comprises a plurality of elements arranged inside and outside a vacuum enclosure ENV. For microelectronics applications, it is recommended to use an enclosure made of alumina alloy if it is desired to limit contamination by metallic elements such as iron, chromium, nickel, or cobalt. It is also possible to use a coating of silicon or of silicon carbide.

A substrate carrier platen PPS, is in the form of a disk in a horizontal plane that is rotatable about its vertical axis AXT, and it receives the substrate SUB that is to be subjected to ion implantation.

The top portion of the enclosure ENV receives the plasma source body CS, that is cylindrical and on the vertical axis AXP. This body is made of quartz. It is surrounded externally, firstly by confinement coils BOCi and BOCj, and secondly by an external radio-frequency antenna ANT. The inlet ING for the plasma-generating gas is coaxial with the vertical axis AXP of the source body CS. This vertical axis AXP meets the surface of the substrate carrier platen PPS on which the substrate SUB for implanting is placed.

It is possible to use any type of pulsed plasma source: inductively coupled plasma (ICP), helicon, microwave, arc. These sources need to operate at pressure levels that are low enough to ensure that the electric field created between the platen PPS at high voltage and the enclosure ENV at ground potential does not ignite a discharge plasma that would disturb the pulsed operation of the source.

The control module of the ion implanter essentially comprises three elements:
  a substrate power supply PS for delivering the high voltage to the substrate SUB;
  a plasma power supply AP for powering the radio-frequency antenna ANT and the confinement coils BOCi, BOCj; and
  a control circuit CC for controlling both power supplies.

Figure 3:
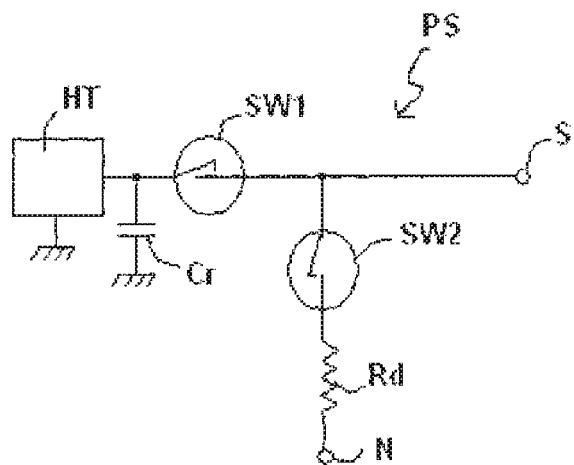
FIG. 3 shows a high-voltage electricity power supply in accordance with the invention.

With reference to FIG. 3, the substrate power supply PS comprises:
  a high voltage generator HT having its positive pole connected to ground;
  a first switch SW1 having its first pole connected to the negative pole of the generator HT and having its second pole connected to the output terminal S of the power supply;
  a second switch SW2 having its first pole connected to the output terminal S and having its second pole connected to a neutralization terminal N, either directly or else via a discharge resistor Rd, typically having a resistance of 1 kilohm (kΩ); and preferably, a regulation capacitor Cr connected in parallel with the generator HT.

The output terminal S is connected to the substrate carrier platen PPS of the implanter.

The neutralization terminal may be connected to ground. It may equally well be connected to the positive pole of a voltage source having its negative pole connected to ground. This positive voltage, generally lying in the range 0 to 100 volts (V) is advantageously selected to be substantially equal to the plasma potential, which often lies in the range +10 V to +20 V.

Figure 4:
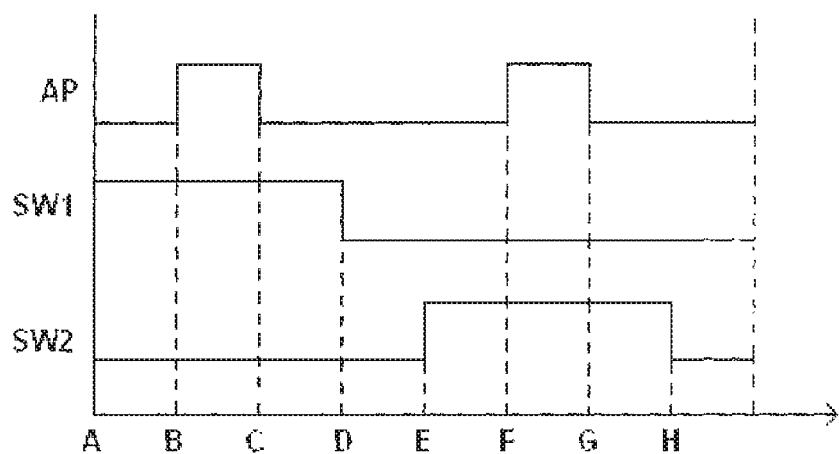
FIG. 4 is a timing chart showing the method of the invention diagrammatically.

With reference to FIG. 4, the control circuit CC controls the plasma power supply AP and the two switches SW1 and SW2 of the substrate power supply PS, as follows.

In an initial state, these three elements are configured in the following manner:

plasma power supply inactivated;
first switch SW1 open; and
second switch SW2 open.

At the beginning of a cycle, an implantation stage takes place that begins by an initialization step represented by point A in FIG. 4.

This initialization step begins by closing the first switch SW1. It extends over a stabilization period that typically lasts in the range 1 microsecond (μs) to 5 μs.

After this initialization step, there follows an activation step (point B in FIG. 4), in which step the plasma power supply AP is activated. The duration of this activation step typically lies in the range 5 μs to 100 μs.

There follows an extinction step (point C in FIG. 4) at the beginning of which the plasma power supply AP is inactivated. This step during which the plasma is extinguished typically lasts for 20 μs to 200 μs. This step ends the implantation stage.

A pause step (point D in FIG. 4) begins by opening the first switch SW1 and terminates at the beginning of the neutralization stage. This step may be a relatively short, but it must last for as long as the first switch SW1 is not fully open and so long as the plasma is not completely extinguished. Its duration is thus greater than 0.1 μs, and typically lies in the range 1 μs to 10 μs.

The neutralization stage begins with a preliminary step (point E in FIG. 4) at the beginning of which the second switch SW2 is closed. This preliminary step lasts as long as the voltage of the substrate-carrier platen has not returned to the voltage applied to the neutralization terminal N. Its duration typically lies in the range 1 μs to 40 μs.

There follows a cancellation step (point F in FIG. 4) during which the plasma power supply AP is activated. The electrons of the plasma are attracted towards the zones of the substrate that are positively charged, and they neutralize that charge. The duration of this cancellation step lies typically in the range 1 μs to 80 μs.

There follows an inactivation step (point G in FIG. 4) at the beginning of which the plasma power supply is deactivated. The duration of this step is typically a few tens of microseconds.

The cycle terminates with an interruption step (point H in FIG. 4) which begins with the second switch SW2 being opened. This interruption step lasts for as long as the second switch is not totally open and so long as the plasma is not totally extinguished, in order to return to the initial step.

A new cycle can then be initiated.

It can be seen that the relaxation stage (between points C and F in FIG. 4) during which the plasma power supply AP is inactivated overlaps the implantation stage and the neutralization stage.

The above-described implementation of the invention has been selected because of its concrete nature. Nevertheless, it is not possible to list exhaustively all possible implementations covered by the invention. In particular, any step or any of the means described may be replaced by an equivalent step or equivalent means without going beyond the ambit of the present invention.

The invention claimed is:

1. A method of controlling an ion implanter having a plasma power supply and a substrate power supply, the substrate power supply comprising:

an electricity generator having its positive pole connected to ground;

a first switch having its first pole connected to the negative pole of said generator and having its second pole connected to the output terminal of said substrate power supply; and a second switch having its first pole connected to said output terminal and having its second pole connected to a neutralization terminal;

the method including an implantation stage during which:
said plasma power supply is activated;
said first switch is closed; and
said second switch is opened;

the method also including a neutralization stage during which:
said first switch is opened; and
said second switch is closed;

the method being characterized in that:
it also includes a relaxation stage that overlaps said implantation stage and said neutralization stage, in which relaxation stage said plasma power supply is inactivated; and said neutralization stage includes a preliminary step for closing said second switch, said preliminary step being followed by a cancellation step for activating said plasma power supply.

2. A method according to claim 1, characterized in that said cancellation step is followed by an inactivation step for deactivating said plasma power supply.

3. A method according to claim 2, characterized in that said in activation step is followed by an interruption step of opening said second switch.

4. A method according to claim 1, characterized in that said implantation stage includes an initialization step for closing said first switch, this initialization step being followed after a stabilization period by an activation step for activating said plasma power supply.

5. A method according to claim 4, characterized in that said activation step is followed by an extinction step for deactivating said plasma power supply.

6. A method according to claim 5, characterized in that said extinction step is followed by a pause step for opening said first switch.

7. An ion implanter, comprising:
a plasma power supply;
a substrate power supply comprising:
an electricity generator having its positive pole connected to ground;
a first switch having its first pole connected to the negative pole of said generator and having its second pole connected to the output terminal of said substrate power supply; and a second switch having its first pole connected to said output terminal and having its second pole connected to a neutralization terminal; and a controller configured to control said plasma and substrate power supplies to implement an implantation stage during which said plasma power supply is activated, said first switch is closed and said second switch is opened, a neutralization stage during which said first switch is opened and said second switch is closed, said neutralization stage including a preliminary step for closing said second switch, said preliminary step being followed by a cancellation step for activating said plasma power supply; and a relaxation stage that overlaps said implantation stage and said neutralization stage, in which relaxation stage said plasma power supply is inactivated.

* * * * *